United States Patent
Joo et al.

(10) Patent No.: US 9,548,099 B2
(45) Date of Patent: Jan. 17, 2017

(54) MEMORY DEVICE WITH ADVANCED REFRESH SCHEME

(71) Applicant: SK hynix Inc., Gyeonggi-do (KR)

(72) Inventors: No-Guen Joo, Gyeonggi-do (KR); Jae-Il Kim, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 49 days.

(21) Appl. No.: 14/542,129

(22) Filed: Nov. 14, 2014

(65) Prior Publication Data

US 2015/0380073 A1    Dec. 31, 2015

(30) Foreign Application Priority Data

Jun. 25, 2014  (KR) .......................... 10-2014-0077971

(51) Int. Cl.
*G11C 11/406* (2006.01)
*G11C 11/408* (2006.01)
*G11C 11/4091* (2006.01)

(52) U.S. Cl.
CPC ............ *G11C 11/406* (2013.01); *G11C 11/408* (2013.01); *G11C 11/4091* (2013.01)

(58) Field of Classification Search
CPC ........ G11C 11/406; G11C 11/408; G11C 5/14; G11C 5/145; G11C 5/143; G11C 5/147
USPC ..................................................... 365/189.05
See application file for complete search history.

(56) References Cited

U.S. PATENT DOCUMENTS

| 5,896,333 A | 4/1999 | Nakashima et al. |
| 8,705,273 B2* | 4/2014 | Kim .......................... G11C 5/14 365/185.03 |
| 8,724,395 B2* | 5/2014 | Park .................... G11C 11/5628 365/185.22 |
| 9,336,852 B2* | 5/2016 | Lim ...................... G11C 11/406 |
| 2012/0155168 A1* | 6/2012 | Kim .......................... G11C 5/14 365/185.03 |
| 2013/0033938 A1* | 2/2013 | Park .................... G11C 11/5628 365/185.22 |
| 2015/0206572 A1* | 7/2015 | Lim ...................... G11C 11/406 365/203 |

FOREIGN PATENT DOCUMENTS

KR   1020150086936   7/2015

* cited by examiner

*Primary Examiner* — Pho M Luu
*Assistant Examiner* — Xiaochun L Chen
(74) *Attorney, Agent, or Firm* — IP & T Group LLP

(57) ABSTRACT

A memory device includes a counter suitable for counting the number of times that a periodic wave is enabled and generating a code, one or more memory banks each including a plurality of word lines, and one or more measurement blocks corresponding to the memory banks, respectively, and suitable for measuring an active period of an activated word line in a corresponding memory bank among the memory banks, wherein each of the measurement blocks measures the active period of the activated word line based on a first value of the code at an activation starting point of the corresponding memory bank and a current value of the code.

22 Claims, 8 Drawing Sheets

MEMORY DEVICE WITH ADVANCED REFRESH SCHEME

CROSS-REFERENCE TO RELATED APPLICATIONS

The present application claims priority of Korean Patent Application No. 10-2014-0077971, filed on Jun. 25, 2014, which is incorporated herein by reference in its entirety.

BACKGROUND

1. Field

Exemplary embodiments of the present invention relate to a memory device.

2. Description of the Related Art

A memory includes a plurality of memory cells. Each memory cell of a memory includes a transistor serving as a switch and a capacitor storing a charge, which represents data. Data is distinguished between a logic high level (logic value '1') and a logic low level (logic value '0') depending on whether there is a charge in a capacitor of a memory cell, in other words, whether the terminal voltage level of the capacitor is high or low.

Data is stored by way of charges accumulated in the capacitor and there is no loss of the stored data or the accumulated charges in theory. However, because of current leakage in the PN junction of a MOS transistor, the initial charge accumulated in the capacitor may disappear, and consequently the data stored in the memory cell may be lost. To prevent data loss, the data stored in the memory cell is read and the charge has to be recharged based on the read data periodically before the stored data is lost, which is called a refresh operation. The refresh operation makes the memory retain the stored data without data loss.

FIG. 1 is a circuit diagram illustrating a portion of a cell array included in a memory device to describe a word line disturbance phenomenon. In FIG. 1, BL represents a bit line.

Referring to FIG. 1, three word lines WLK−1, WLK, and WLK+1 are arranged in parallel in the cell array. The word line WLK with notation "HIGH_ACT" is an activated word line. The word lines WLK−1 and WLK+1 are disposed adjacent to the word line WLK. Also, memory cells CELL_K−1, CELL_K, and CELL_K+1 are coupled to the word lines WLK−1, WLK, and WLK+1, respectively. The memory cells CELL_K−1, CELL_K and CELL_K+1 include cell transistors TR_K−1, TR_K, and TR_K+1 and cell capacitors CAP_K−1, CAP_K, and CAP_K+1, respectively.

When the word line WLK is activated, voltages of the word lines WLK−1 and WLK+1 fluctuate due to a coupling effect between the word line WLK and the word lines WLK−1 and WLK+1, thereby affecting the amount of charge stored in the cell capacitors CAP_K−1 and CAP_K+1 of the word lines WLK−1 and WLK+1, which is referred to as word line disturbance. In other words, the probability of data loss of the memory cells CELL_K−1 and CELL_K+1 corresponding to the neighboring word lines WLK−1 and WLK+1 of the active word line WLK increases, which may become more severe as the active word line WLK is activated for a longer period.

SUMMARY

Various embodiments of the present invention are directed to a memory device providing a scheme that prevents data loss of memory cells corresponding to peripheral word lines even when an active word line is activated for a long period.

In accordance with an embodiment of the present invention, a memory device includes a counter suitable for counting the number of times that a periodic wave is enabled and generating a code, one or more memory banks each including a plurality of word lines, and one or more measurement blocks corresponding to the memory banks, respectively, and suitable for measuring an active period of an activated word line in a corresponding memory bank among the memory banks, wherein each of the measurement blocks measures the active period of the activated word line based on a first value of the code at an activation starting point of the corresponding memory bank and a current value of the code.

The memory device may further include one or more refresh blocks corresponding to the memory banks, respectively, and suitable for refreshing word lines in a corresponding memory bank among the memory banks, wherein each of the refresh blocks refreshes one or more word lines adjacent to a first word line when an active period of the first word line is measured to exceed a threshold value by a corresponding measurement block among the measurement blocks.

Each of the measurement blocks may include a latch suitable for latching the code at the activation starting point of the corresponding memory bank, and a sensing unit suitable for generating a corresponding threshold signal based on a value of a latched code stored in the latch and the current value of the code.

In accordance with another embodiment of the present invention, a memory device includes one or more memory banks each including a plurality of word lines, and one or more measurement blocks corresponding to the memory banks, respectively, and suitable for measuring an active period of an activated word line in a corresponding memory bank among the memory banks, wherein each of the measurement blocks measures the active period of the activated word line based on the number of times that a periodic wave transitions in an active period of the corresponding memory bank.

The memory device may further include a counter suitable for counting the number of times that the periodic wave is enabled and generating a code, wherein each of the measurement blocks measures the active period of the activated word line based on the number of times that a value of the code changes in the active period of the corresponding memory bank.

The memory device may further include one or more refresh blocks corresponding to the memory banks, respectively, and suitable for refreshing word lines in a corresponding memory bank among the memory banks, wherein each of the refresh blocks refreshes one or more word lines adjacent to a first word line when an active period of the first word line is measured to exceed a threshold value by a corresponding measurement block among the measurement blocks.

Each of the measurement blocks may include a first transition sensing unit suitable for sensing that a predetermined bit of the code transitions from a logic low level to a logic high level in the active period of the corresponding memory bank and generating a first sensing signal, a second transition sensing unit suitable for sensing that the predetermined bit of the code transitions from the logic high level to the logic low level in the active period of the corresponding memory bank and generating a second sensing signal, and a threshold signal generation unit suitable for generating a corresponding threshold signal based on the first sensing signal and the second sensing signal.

In accordance with another embodiment of the present invention, a memory device includes a counter suitable for counting the number of times that a periodic wave is enabled and generating a code, an active signal generation block suitable for generating first to $N^{th}$ active signals based on an active command, a precharge command and a bank address, wherein the N is a natural number greater than 1, first to $N^{th}$ memory banks suitable for activating a word line selected in response to a corresponding active signal among the first to $N^{th}$ active signals, and first to $N^{th}$ measurement blocks suitable for measuring an active period of a corresponding active signal among the first to $N^{th}$ active signals based on the code.

The memory device may further include a refresh circuit suitable for performing a control to refresh one or more word lines disposed adjacent to a word line selected in a $K^{th}$ memory bank among the first to $N^{th}$ memory banks when it is measured in the first to $N^{th}$ measurement blocks that an active period of a $K^{th}$ active signal exceeds a threshold value among the first to $N^{th}$ active signals, where the K is a natural number ranging from 1 to N.

Each of the first to $N^{th}$ measurement blocks may include a latch suitable for latching the code at an activation starting point of the corresponding active signal, and a sensing unit suitable for generating a corresponding threshold signal based on a value of a latched code stored in the latch and a current value of the code.

Each of the first to $N^{th}$ measurement blocks may include a first transition sensing unit suitable for sensing that a predetermined bit of the code transitions from a logic low level to a logic high level in the active period of the corresponding active signal and generating a first sensing signal, a second transition sensing unit suitable for sensing that the predetermined bit of the code transitions from the logic high level to the logic low level in the active period of the corresponding active signal and generating a second sensing signal, and a threshold signal generation unit suitable for generating a corresponding threshold signal based on the first sensing signal and the second sensing signal.

DETAILED DESCRIPTION

Figure 1:
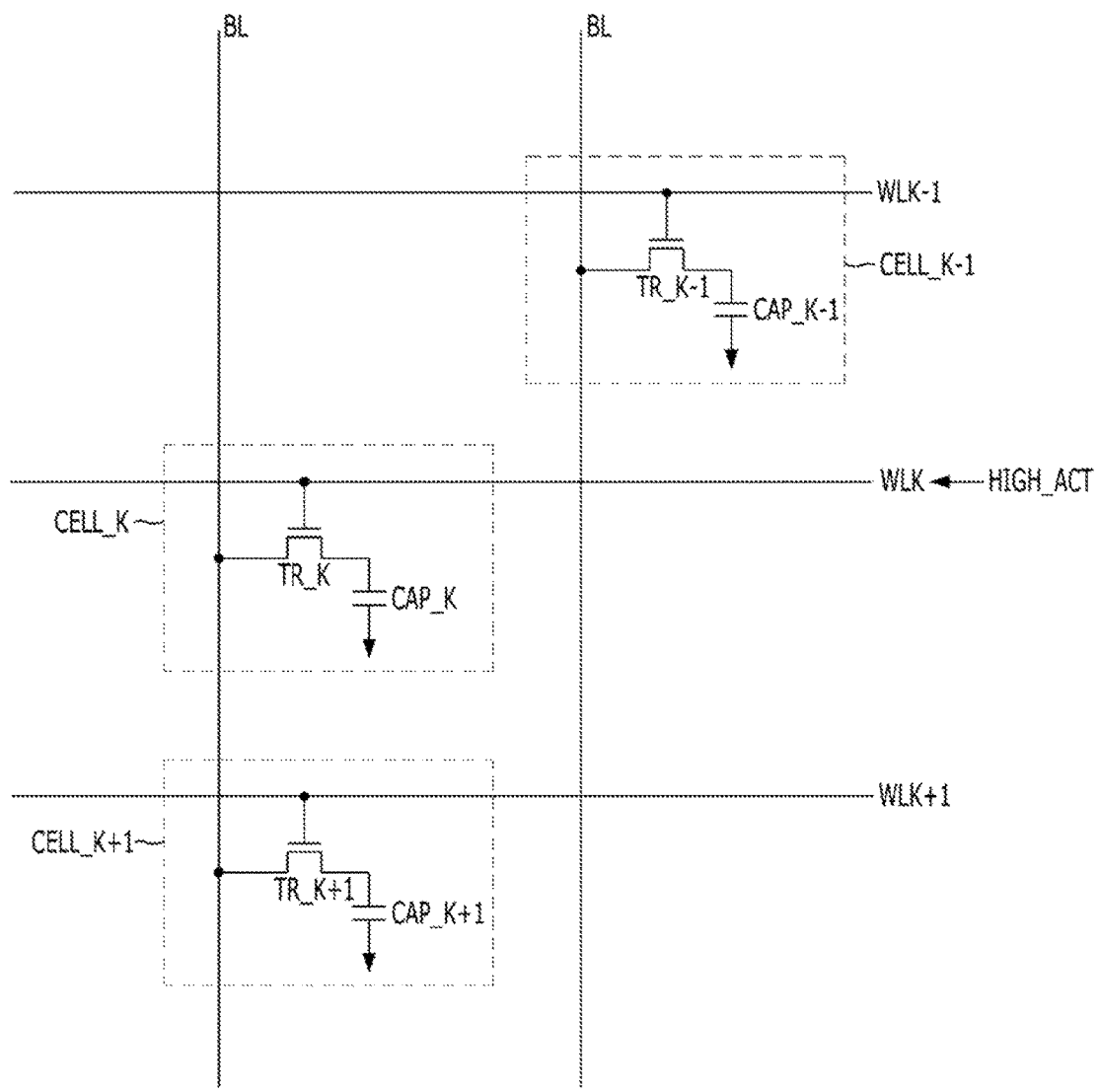
FIG. 1 is a circuit diagram illustrating a portion of a cell array included in a memory device to describe a word line disturbance phenomenon.

Exemplary embodiments of the present invention are described below in more detail with reference to the accompanying drawings. These embodiments are provided so that this disclosure is thorough and complete, and fully conveys the scope of the present invention to those skilled in the art. All "embodiments" referred to in this disclosure refer to embodiments of the inventive concept disclosed herein. The embodiments presented are merely examples and are not intended to limit the inventive concept.

In the drawings, thicknesses and lengths of components are exaggerated compared to actual physical thickness and intervals for convenience of illustration. In the following description, a detailed explanation of known related functions and constitutions may be omitted to avoid unnecessarily obscuring the subject manner of the present invention. Furthermore, 'connected/coupled' represents that one component is directly coupled to another component or indirectly coupled through another component. In this specification, a singular form may include a plural form as long as it is not specifically mentioned in a sentence. Throughout the disclosure, like reference numerals refer to like parts throughout the various figures and embodiments of the present invention.

Figure 2:
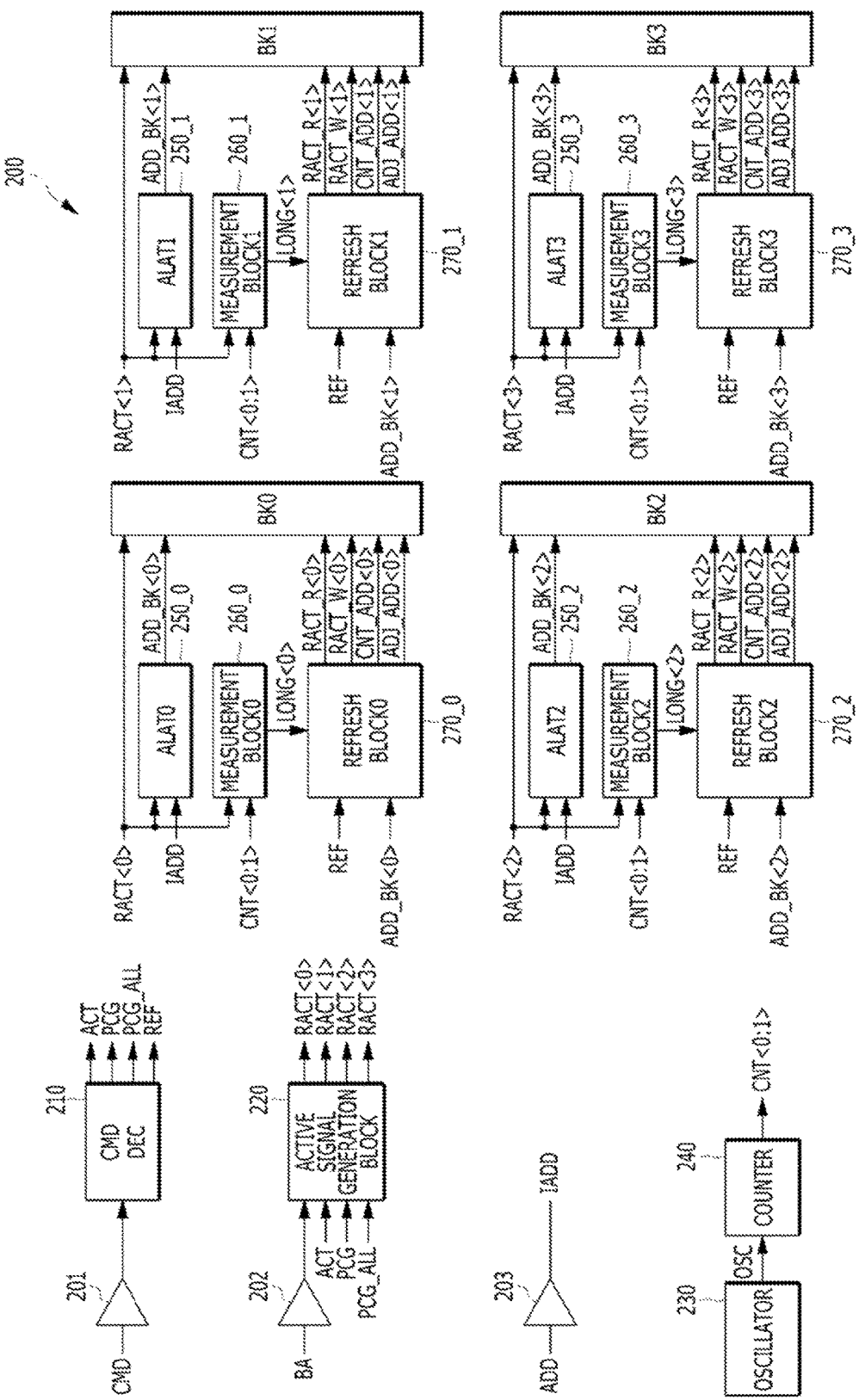
FIG. 2 is a block diagram illustrating a memory device 200 in accordance with an embodiment of the present invention.

FIG. 2 is a block diagram illustrating a memory device 200 in accordance with an embodiment of the present invention.

Referring to FIG. 2, the memory device 200 may include a command reception block 201, a bank address reception block 202, an address reception block 203, a command decoder 210, an active signal generation block 220, an oscillator 230, a counter 240, first to fourth memory banks BK0 to BK3, first to fourth address latches 250_0 to 250_3, first to fourth measurement blocks 260_0 to 260_3, and first to fourth refresh blocks 270_0 to 270_3. FIG. 2 shows structures related to an active operation and a refresh operation of the memory device 200. Descriptions of structures related to other operations of a memory device, such as read and write operations are omitted since they are not directly related to the present invention.

The command reception block 201 may receive a command CMD transmitted from the outside of the memory device 200, i.e., a memory controller. The command CMD may include multi-bit command signals. The command signals included in the command CMD may be a chip selection signal CS, a row address strobe signal RAS, a column address strobe signal CAS, an active signal ACT, and a write enable signal WE.

The bank address reception block 202 may receive a bank address BA transmitted from the outside of the memory device 200, and the address reception block 203 may receive an address ADD transmitted from the outside of the memory device 200. The bank address BA is an address for selecting a memory bank to be accessed among the memory banks BK0 to BK3, and the address ADD is an address for selecting a memory cell to be accessed in the selected memory bank. In other words, the bank address BA may be an upper-level address of the address ADD. Although the bank address BA is described as the address for selecting the memory bank to be accessed among the memory banks BK0 to BK3 in the embodiment, a bank group address may be used together with the bank address BA.

The command decoder 210 may generate internal commands by decoding the command CMD transmitted to the command reception block 201. The internal commands generated from the command decoder 210 may include an active command ACT, a precharge command PCG, a precharge all command PCT_ALL, and a refresh command REF. The command decoder 210 may enable the active command ACT when the combination of signals included in the command CMD corresponds to the active command ACT, and it may enable the precharge command PCT when the combination of the signals included in the command CMD corresponds to the precharge command PCT. Also, the command decoder 210 may enable the refresh command REF when the combination of the signals included in the command CMD corresponds to the refresh command REF, and it may enable the precharge all command PCT_ALL when the combination of the signals included in the command CMD corresponds to the precharge all command PCT_ALL. Although the command decoder 210 may generate other internal commands such as a read command and a write command by decoding the command CMD, these will not be described because such internal commands are not directly related to the present invention.

The active signal generation block 220 may generate first to fourth active signals RACT<0> to RACT<3> corresponding to the first to fourth memory banks BK0 to BK3, respectively, in response to the active command ACT, the precharge command PCG, the bank address BA and the precharge all command PCT_ALL. The active signal generation block 220 may enable an active signal corresponding to a bank selected based on the bank address BA when the active command ACT is enabled. For example, when the second bank BK1 is selected based on the bank address BA, and the active command ACT is enabled, the active signal generation block 220 may enable the second active signal RACT<1>.

The active signal generation block 220 may disable an active signal corresponding to a bank selected based on the bank address BA when the precharge command PCT is enabled. For example, when the fourth bank BK3 is selected based on the bank address BA, and the precharge command PCT is enabled while the active signals RACT<0> and RACT<3> are enabled, the fourth active signal RACT<3> may be disabled. The first active signal RACT<0> may keep being enabled.

The active signal generation block 220 may disable all active signals which are enabled regardless of the bank address BA when the precharge all command PCG_ALL is enabled. For example, when the precharge all command PCT_ALL is enabled while the active signals RACT<1> and RACT<2> are enabled, the active signals RACT<1> and RACT<2> which are enabled may be disabled regardless of the bank address BA.

The first to fourth address latches 250_0 to 250_3 may correspond to the first to fourth memory banks BK0 to BK3, respectively. Each of the address latches 250_0 to 250_3 may latch an address IADD at a moment when a corresponding active signal begins to be enabled among the active signals RACT<0> to RACT<3> for an active period of the corresponding active signal. For example, the address latch 250_2 may receive and store the address IADD at a moment when the active signal RACT<2> is enabled from a logic low level to a logic high level, and it may maintain a stored value ADD_BK<2> until the active signal RACT<2> is disabled from a logic high level to a logic low level. Through the operation described above, the address latches 250_0 to 250_3 may have addresses ADD_BK<0> to ADD_BK<3> maintain constant values in active periods of the corresponding memory banks BK0 to BK3.

Each of the first to fourth memory banks BK0 to BK3 may activate a word line corresponding to an address stored in a corresponding address latch among the address latches 250_0 to 250_3 in an active period of a corresponding active signal among the active signals RACT<0> to RACT<3>. For example, the second memory bank BK1 may activate a word line corresponding to the address ADD_BK<1> stored in the address latch 250_1 in an active period of the active signal RACT<1>.

The oscillator 230 may generate a periodic wave OSC. The counter 240 may count the number of times that the periodic wave OSC is enabled and generate a code CNT<0:1>. The value of the code CNT<0:1> may change as shown by 0→1→2→3→0→1→2→3 . . . whenever the periodic wave OSC is enabled. Although it is described in the embodiment that that the periodic wave OSC is generated in the oscillator 230, a signal such as a clock inputted from the outside of the memory device 200 may be used as the periodic wave OSC. The code CNT<0:1> generated in the counter 240 may be used for the measurement blocks 260_0 to 260_3. The period of the periodic wave OSC generated in the oscillator 230 may be properly controlled based on a time reference with which threshold signals LONG<0> to LONG<3> are enabled. For example, the periodic wave OSC may be set to have a short period as the measurement blocks 260_0 to 260_3 enable the threshold signals LONG<0> to LONG<3> with a short time reference, and the periodic wave OSC may be set to have a long period as the measurement blocks 260_0 to 260_3 enable the threshold signals LONG<0> to LONG<3> with a long time reference.

Each of the first to fourth measurement blocks 260_0 to 260_3 may measure an active period of a word line in a corresponding memory bank among the memory banks BK0 to BK3. Since active periods of word lines selected based on the addresses ADD_BK<0> to ADD_BK<3> in the memory banks BK0 to BK3 coincide with the active periods of the active signals RACT<0> to RACT<3>, the measurement blocks 260_0 to 260_3 may measure the active periods of the word lines by measuring the active periods of the active signals RACT<0> to RACT<3>. Each of the first to fourth measurement blocks 260_0 to 260_3 may enable a corresponding threshold signal among the threshold signals LONG<0> to LONG<3> when an active period of a corresponding memory bank among the memory banks BK0 to BK3 is measured to exceed a threshold value. For example, when the active period of the memory bank BK2 exceeds the threshold value, the measurement block 260_2 may enable the threshold signal LONG<2>. The measurement blocks 260_0 to 260_3 may use the code CNT<0:1> when measuring the active periods.

The refresh blocks 270_0 to 270_3 may control the word lines of the respective memory banks BK0 to BK3 to be sequentially refreshed whenever the refresh command REF is enabled. Each of the refresh blocks 270_0 to 270_3 may control and refresh one or more word lines disposed adjacent to a word line that is excessively activated in a corresponding memory bank the memory banks BK0 to BK3, when a corresponding threshold signal is enabled among the threshold signals LONG<0> to LONG<3>. For example, the refresh block 270_0 may control the word lines of the memory bank BK0 to be sequentially refreshed whenever the refresh command REF is enabled, and the refresh block 270_0 may control one or more word lines disposed adjacent to a predetermined word line to be refreshed when an active period of the predetermined word line is longer than a threshold value, and the threshold signal LONG<0> is enabled in the memory bank BK0.

Figure 3:
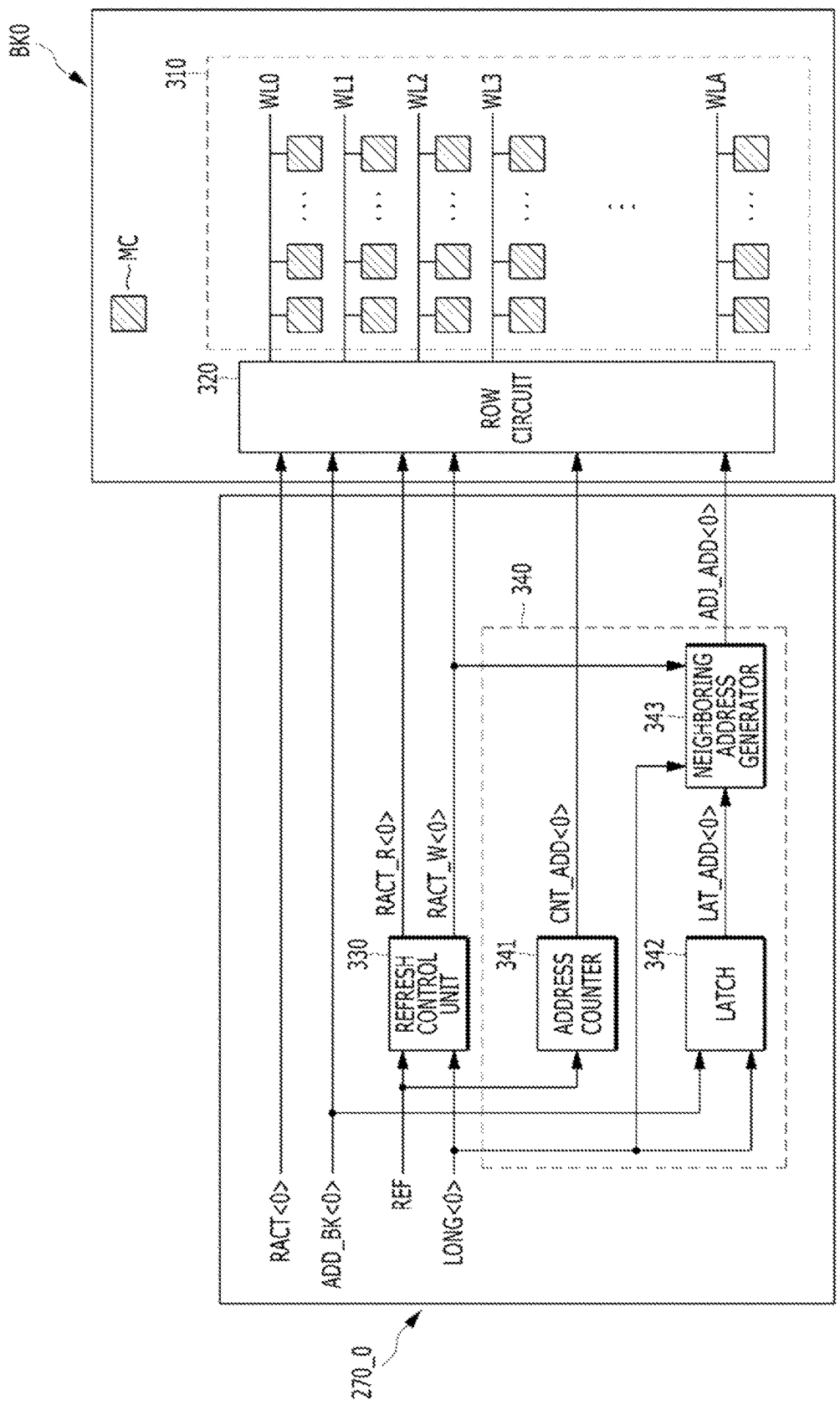
FIG. 3 is a block diagram illustrating a first memory bank BK0 and a first refresh block 270_0 shown in FIG. 2.

FIG. 3 is a block diagram illustrating a first memory bank BK0 and a first refresh block 270_0 shown in FIG. 2. Although FIG. 3 illustrates in detail the first memory bank BK0 and the first refresh block 270_0, the second to fourth memory banks BK1 to BK3 and the second to fourth refresh blocks 270_1 to 270_3 may be designed similarly as shown in FIG. 3.

Referring to FIG. 3, the first memory bank BK0 may include a cell array 310 and a row circuit 320.

The cell array 310 may include a plurality of word lines WL0 to WLA, where A is a natural number. Each of the word lines WL0 to WLA may be coupled with one or more memory cells MC. The word lines WL0 to WLA may be arranged in the order of WL0→WL1→WL2 . . . WLA-1→WLA.

The row circuit 320 may control the word lines WL0 to WLA to be activated/deactivated in response to the active signal RACT<0>. The row circuit 320 may activate a word line selected based on the address ADD_BK<0> among the word lines WL0 to WLA while the active signal RACT<0> is enabled. Also, the row circuit 320 may perform a refresh operation in response to active signals RACT_R<0> and RACT_W<0> for the refresh operation. Herein, the refresh operation may be performed the same as an active operation. The row circuit 320 may activate a word line selected based on a counting address CNT_ADD<0> among the word lines WL0 to WLA while the active signal RACT_R<0> is enabled. Also, the row circuit 320 may activate a word line selected based on a neighboring address ADJ_ADD<0> among the word lines WL0 to WLA while the active signal RACT_W<0> is enabled.

The first refresh block 270_0 may control the word lines WL0 to WLA to be sequentially activated in response to an enabling of the refresh command REF. When the threshold signal LONG<0> is enabled, in other words, when it is detected that a particular word line, e.g., the word line WLK, is activated for a long period, the first refresh block 270_0 may perform a control to additionally refresh word lines, e.g., the word lines WLK-1 and WLK+1, disposed adjacent to the word line WLK, in response to the enabling of the refresh command REF. The first refresh block 270_0 may include a refresh control unit 330 and an address generation unit 340.

The refresh control unit 330 may generate the active signals RACT_R<0> and RACT_W<0> for the refresh operation in response to the refresh command REF and the threshold signal LONG<0>. The refresh control unit 330 may enable the active signal RACT_R<0> in response to the enabling of the refresh command REF. When the threshold signal LONG<0> is enabled, the refresh control unit 330 may sequentially enable the active signals RACT_R<0> and RACT_W<0> in response to the enabling of the refresh command REF for a two-cycle refresh operation, in other words, while the refresh command is enabled twice.

The address generation unit 340 may generate the counting address CNT_ADD<0> and the neighboring address ADJ_ADD<0> in response to the refresh command REF and the threshold signal LONG<0>. The address generation unit 340 may include an address counter 341, a latch 342, and a neighboring address generator 343.

The address counter 341 may change a value of the counting address CNT_ADD<0> in response to the enabling of the refresh command REF. For example, the address counter 341 may increase the value of the counting address CNT_ADD<0> by 1 whenever the refresh command REF is enabled.

The latch 342 may receive and store the address ADD_BK<0> latched in the address latch 250_0 at a moment when the threshold signal LONG<0> is enabled. An address LAT_ADD<0> stored in the latch 342 is an address corresponding to a word line, e.g., the word line WLK, which is activated over a threshold value. The neighboring address generator 343 may generate the neighboring address ADJ_ADD<0> based on the address LAT_ADD<0> stored in the latch 342. The neighboring address generator 343 may generate and output a value obtained by subtracting 1 from the address LAT_ADD<0> stored in the latch 342 as the neighboring address ADJ_ADD<0> when the active signal RACT_W<0> is enabled firstly after the threshold signal LONG<0> is enabled, and it may generate and output a value obtained by adding 1 to the address LAT_ADD<0> stored in the latch 342 as the neighboring address ADJ_ADD<0> when the active signal RACT_W<0> is enabled secondly after the threshold signal LONG<0> is enabled. For example, when the word line WLK is activated over the threshold value, the word line WLK-1 is refreshed in response to the first enablement of the active signal RACT_W<0>, and the word line WLK+1 is refreshed in response to the second enablement of the active signal RACT_W<0>. Herein, K is an integer ranging from 0 to A. When K is '0', K-1 may be 'A', and when K is 'A', K+1 may be '0'.

Figure 4:
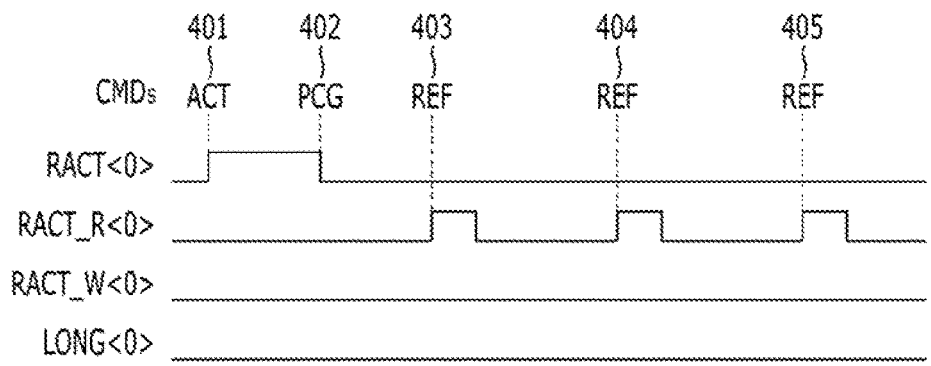
FIG. 4 is a timing diagram illustrating an operation of the first refresh block 270_0.
Figure 5:
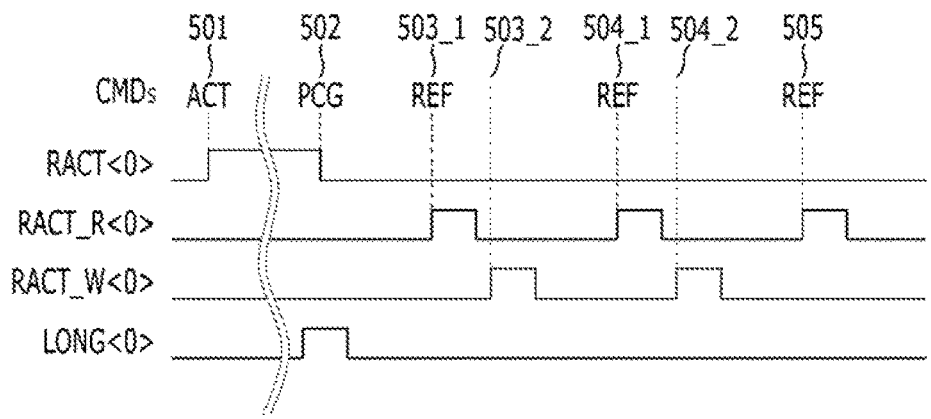
FIG. 5 is a timing diagram illustrating an operation of the first refresh block 270_0.

FIGS. 4 and 5 are timing diagrams illustrating an operation of the first refresh block 270_0. FIG. 4 illustrates an operation performed when there is no word line activated longer than the threshold value in the memory bank BK0, and FIG. 5 illustrates an operation performed when there is a word line activated longer than the threshold value in the memory bank BK0.

Referring to FIG. 4, when a bank address corresponds to the memory bank BK0, the first active signal RACT<0> is enabled in response to the active command ACT applied at a moment 401, and the first active signal RACT<0> is disabled in response to the precharge command PCG applied at a moment 402. During this period, a word line corresponding to the address ADD_BK<0> stored in the first address latch 250_0 may be activated.

The active signal RACT_R<0> is enabled in response to the refresh command REF applied at a moment 403. During this period, a word line, e.g., the word line WLN, corresponding to the counting address CNT_ADD<0> may be activated.

The active signal RACT_R<0> is enabled in response to the refresh command REF applied at a moment 404. During this period, a word line, e.g., the word line WLN+1, corresponding to the counting address CNT_ADD<0> may be activated. Since the word line WLN is activated in the refresh operation at the moment 403, the word line WLN+1 is activated in the refresh operation at the moment 404. Similarly, a word line WLN+2 is activated in the refresh operation at a moment 405.

Referring to FIG. 5, when a bank address corresponds to the memory bank BK0, the first active signal RACT<0> is enabled in response to the active command ACT applied at a moment 501, and the first active signal RACT<0> is disabled in response to the precharge command PCG applied at a moment 502. During this period, a word line corresponding to the address ADD_BK<0> stored in the first address latch 250_0 may be activated. Since the first active signal RACT<0> is enabled longer than a threshold value, it may be seen that the threshold signal LONG<0> is enabled.

The active signal RACT_R<0> is enabled in response to the refresh command REF applied at a moment 503_1. During this period, a word line, e.g., the word line WLN, corresponding to the counting address CNT_ADD<0> may be activated. Subsequently, the active signal RACT_W<0> is enabled at a moment 503_2. During this period, a word line, e.g., the word line WLK−1, corresponding to the neighboring address ADJ_ADD<0> may be activated.

The active signal RACT_R<0> is enabled in response to the refresh command REF applied at a moment 504_1. During this period, a word line, e.g., the word line WLN+1, corresponding to the counting address CNT_ADD<0> may be activated. Subsequently, the active signal RACT_W is enabled at a moment 504_2. During this period, a word line, e.g., the word line WLK+1, corresponding to the neighboring address ADJ_ADD<0> may be activated.

The active signal RACT_R<0> is enabled in response to the refresh command REF applied at a moment 505. During this period, a word line, e.g., the word line WLN+2, corresponding to the counting address CNT_ADD<0> may be activated. Since the operation of refreshing the neighboring word lines WLK−1 and WLK+1 of the word line WLK activated for a long period over the threshold value is completed at the moment 504_2, the active signal RACT_R<0> is enabled in response to the refresh command REF applied at the moment 505, and the active signal RACT_W<0> is not enabled.

Referring to FIG. 5, it may be seen that the neighboring word lines WLK−1 and WLK+1 of the word line WLK are refreshed when the word line WLK is enabled for a long period in the first memory bank BK0. Through such a refresh operation, although the word line WLK is activated for a long period and the data of the memory cells corresponding to the neighboring word lines WLK−1 and WLK+1 thereof become unstable, the refresh operation is directly performed on the memory cells and the data may be prevented from being lost from the memory cells.

Figure 6:
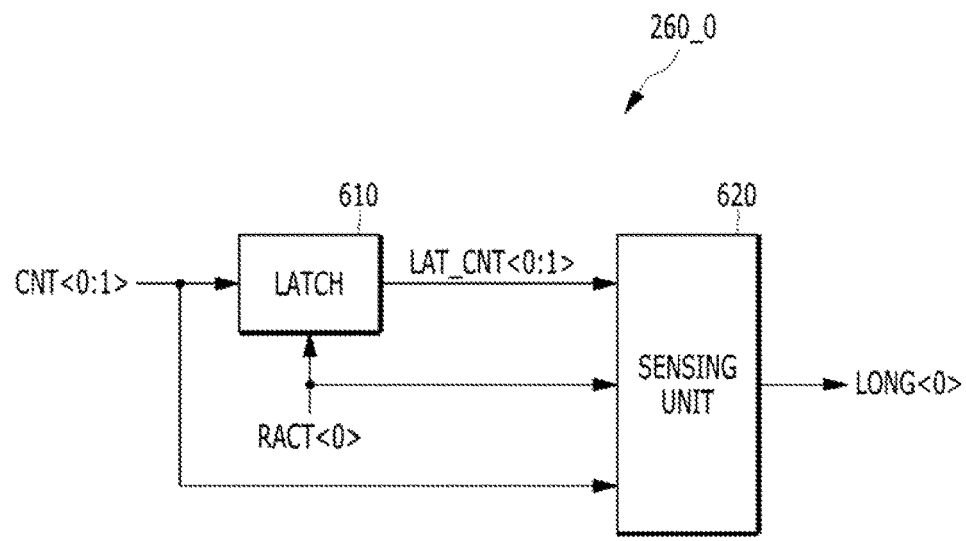
FIG. 6 is a block diagram exemplarily illustrating a first measurement block 260_0 shown in FIG. 2.

FIG. 6 is a block diagram exemplarily illustrating the first measurement block 260_0 shown in FIG. 2. Although FIG. 6 illustrates the first measurement block 260_0, the second to fourth measurement blocks 260_1 to 260_3 may be designed similarly as shown in FIG. 6.

The first measurement block 260_0 may measure an active period of a word line, i.e., an active period of the first active signal RACT<0> in the first memory bank BK0 based on the first value of the code CNT<0:1> at an activation starting point of the first memory bank BK0 and the current value of the code CNT<0:1>. The first measurement block 260_0 may include a latch 610 and a sensing unit 620.

The latch 610 may latch the code CNT<0:1> at the activation starting point of the first memory bank BK0, i.e., at the moment when the first active signal RACT<0> transitions from a logic low level to a logic high level.

The sensing unit 620 may generate the threshold signal LONG<0> based on the value of the code LAT_CNT<0:1> stored in the latch 610, i.e., the first value of the code CNT<0:1> at the activation starting point, and the current value of the code CNT<0:1>. To be specific, the sensing unit 620 may enable the threshold signal LONG<0> which is a pulse signal when the difference between the value of the code LAT_CNT<0:1> and the current value of the code CNT<0:1> exceeds a predetermined value, e.g., 2. The sensing unit 620 may be enabled in an enabling period of the first active signal RACT<0> and disabled in a disabling period of the first active signal RACT<0>. When the sensing unit 620 is disabled, the threshold signal LONG<0> may be maintained in a disabling state regardless of the values of the codes LAT_CNT<0:1> and CNT<0:1>.

The code CNT<0:1> is required for an operation of the first measurement block 260_0, and the oscillator 230 and the counter 240 are required to generate the code CNT<0:1>. This is the same with the second to fourth measurement blocks 260_1 to 260_3. As the measurement blocks 260_0 to 260_3 share the oscillator 230 and the counter 240 with each other, the areas occupied by those circuits may be reduced.

Figure 7:
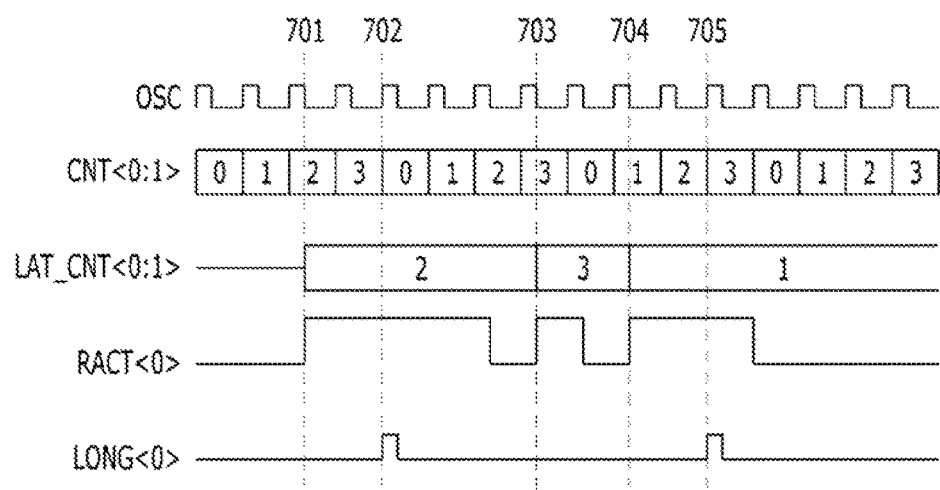
FIG. 7 is a timing diagram illustrating an operation of the first measurement block 260_0 shown in FIG. 6.

FIG. 7 is a timing diagram illustrating an operation of the first measurement block 260_0 shown in FIG. 6.

Referring to FIG. 7, the value of the code CNT<0:1> may change as shown by 0→1→2→3→0→1 . . . whenever the periodic wave OSC is enabled to a logic high level.

The first active signal RACT<0> is enabled at a moment 701. The value 2 of the code CNT<0:1> at the moment 701 may be stored in the latch 610 in response to the enabling of the first active signal RACT<0>. Since the first active signal RACT<0> is maintained in the enabling state until the value 2 of the code LAT_CNT<0:1> stored in the latch 610 is different from the current value of the code CNT<0:1> by 2 or more, the threshold signal LONG<0> may be enabled at the moment 702.

The first active signal RACT<0> is enabled again at a moment 703. The value 3 of the code CNT<0:1> at the moment 703 may be stored in the latch 610 in response to the enabling of the first active signal RACT<0>. Since the first active signal RACT<0> is not maintained in the enabling state until the value of the code LAT_CNT<0:1> stored in the latch 610 is different from the current value of the code CNT<0:1> by 2 or more, the threshold signal LONG<0> may not be enabled.

The first active signal RACT<0> is enabled again at a moment 704. The value 1 of the code CNT<0:1> at the moment 704 may be stored in the latch 610 in response to the enabling of the first active signal RACT<0>. Since the first active signal RACT<0> is maintained in the enabling state until the value 1 of the code LAT_CNT<0:1> stored in the latch 610 is different from the current value of the code CNT<0:1> by 2 or more, the threshold signal LONG<0> may be enabled at the moment 705.

Figure 8:
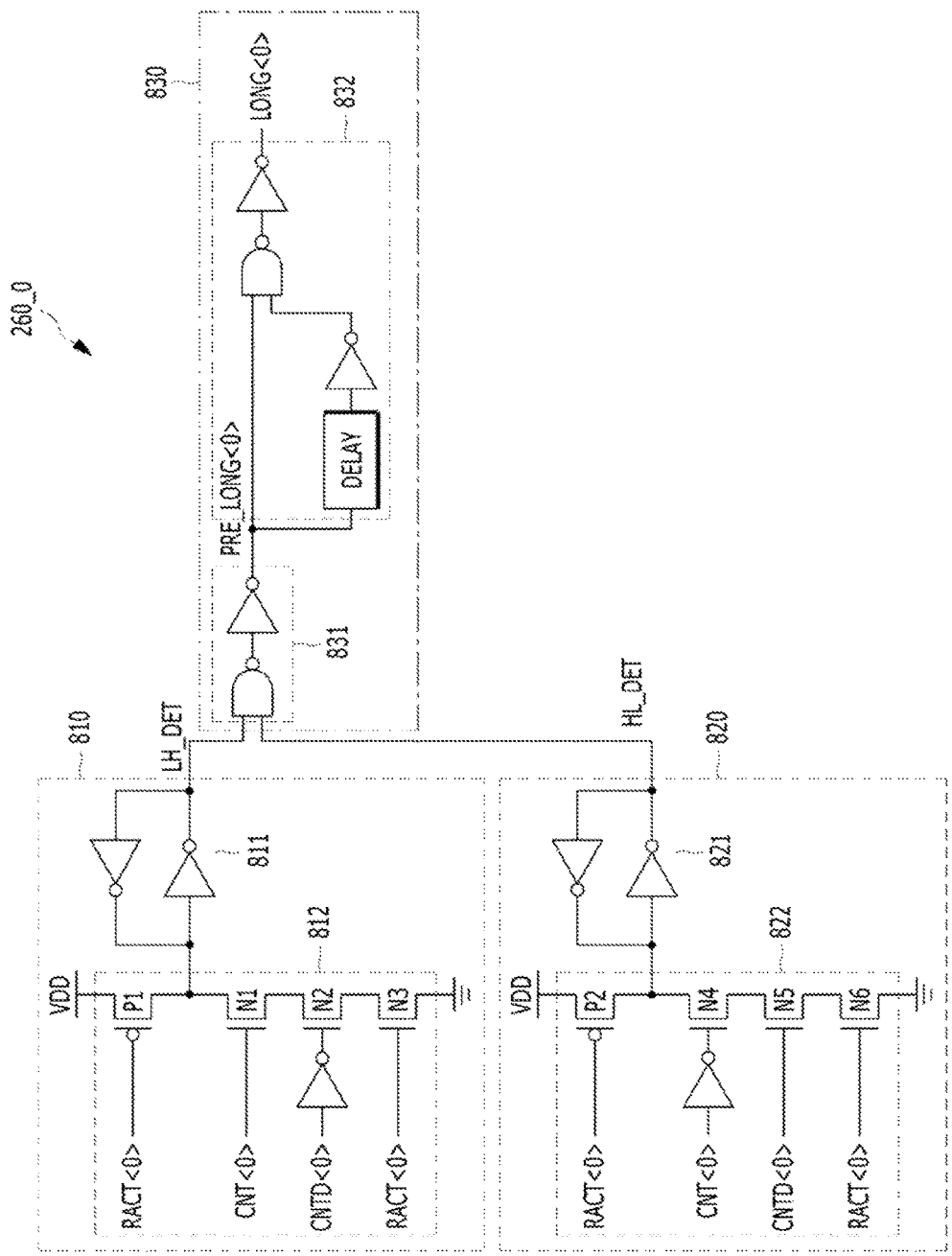
FIG. 8 is a circuit diagram exemplarily illustrating the first measurement block 260_0 shown in FIG. 2.

FIG. 8 is a circuit diagram exemplarily illustrating the first measurement block 260_0 shown in FIG. 2. Although FIG. 8 illustrates the first measurement block 260_0, the second to fourth measurement blocks 260_1 to 260_3 may be designed similarly as shown in FIG. 8.

The first measurement block 260_0 may measure an active period of a word line, i.e., an active period of the first active signal RACT<0>, in the first memory bank BK0 based on the number of times that the value of the code CNT<0:1> changes in the active period of the first memory bank BK0. Since a least significant bit (LSB) of the code CNT<0:1>, e.g., a bit CNT<0>, changes whenever the value of the code CNT<0:1> changes, the first measurement block 260_0 may measure the active period of the first active signal RACT<0> based on the bit CNT<0>. Although it is described as an example that the first measurement block 260_0 measures the active period of the first active signal RACT<0> based on the bit CNT<0>, the first measurement block 260_0 may measure the active period of the first active signal RACT<0> based on the bit CNT<1>.

The first measurement block 260_0 may include a first transition sensing unit 810, a second transition sensing unit 820, and a threshold signal generation unit 830.

The first transition sensing unit 810 may sense the bit CNT<0> transitioning from a logic low level to a logic high level in the active period of the first active signal RACT<0> and generate a first sensing signal LH_DET. The first transition sensing unit 810 may include a first latch 811 and a first driving part 812. The first latch 811 latches the first sensing signal LH_DET. The first driving part 812 drives the first sensing signal LH_DET to a disabling level in response to a disabling of the first active signal RACT<0> and drives the first sensing signal LH_DET to an enabling level when the bit CNT<0> transitions from a logic low level to a logic high level while the first active signal RACT<0> is enabled. While the first active signal RACT<0> is disabled to a logic low level, a transistor P1 is turned on, and the first sensing signal LH_DET may be disabled to a logic low level. When the first active signal RACT<0> is enabled to a logic high level, a transistor N3 is turned on. Under this circumstance, when the bit CNT<0> transitions from a logic low level to a logic high level, transistors N1 and N2 are simultaneously turned on, and the first sensing signal LH_DET may be enabled to a logic high level. Herein, a bit CNTD<0> is a delayed signal of the bit CNT<0>.

The second transition sensing unit 820 may sense the bit CNT<0> transitioning from a logic high level to a logic low level in the active period of the first active signal RACT<0> and generate a second sensing signal HL_DET. The second transition sensing unit 820 may include a second latch 821 and a second driving part 822. The second latch 821 latches the second sensing signal HL_DET. The second driving part 822 drives the second sensing signal HL_DET to a disabling level in response to a disabling of the first active signal RACT<0> and drives the second sensing signal HL_DET to an enabling level when the bit CNT<0> transitions from a logic high level to a logic low level while the first active signal RACT<0> is enabled. While the first active signal RACT<0> is disabled to a logic low level, a transistor P2 is turned on, and the second sensing signal HL_DET may be disabled to a logic low level. When the first active signal RACT<0> is enabled to a logic high level, a transistor N6 is turned on. Under this circumstance, when the bit CNT<0> transitions from a logic high level to a logic low level, transistors N4 and N5 are simultaneously turned on, and the second sensing signal HL_DET may be enabled to a logic high level.

The threshold signal generation unit 830 may generate the threshold signal LONG<0> based on the first sensing signal LH_DET and the second sensing signal HL_DET. To be specific, the threshold signal generation unit 830 may enable the threshold signal LONG<0> when the first sensing signal LH_DET and the second sensing signal HL_DET are enabled. The threshold signal generation unit 830 may include an enabling part 831 for enabling a preliminary signal PRE_LONG<0> when the first sensing signal LH_DET and the second sensing signal HL_DET are enabled to a logic high level and a pulse generation part 832 for generating the threshold signal LONG<0> which is a pulse signal enabled at a moment when the preliminary signal PRE_LONG<0> is enabled.

Figure 9:
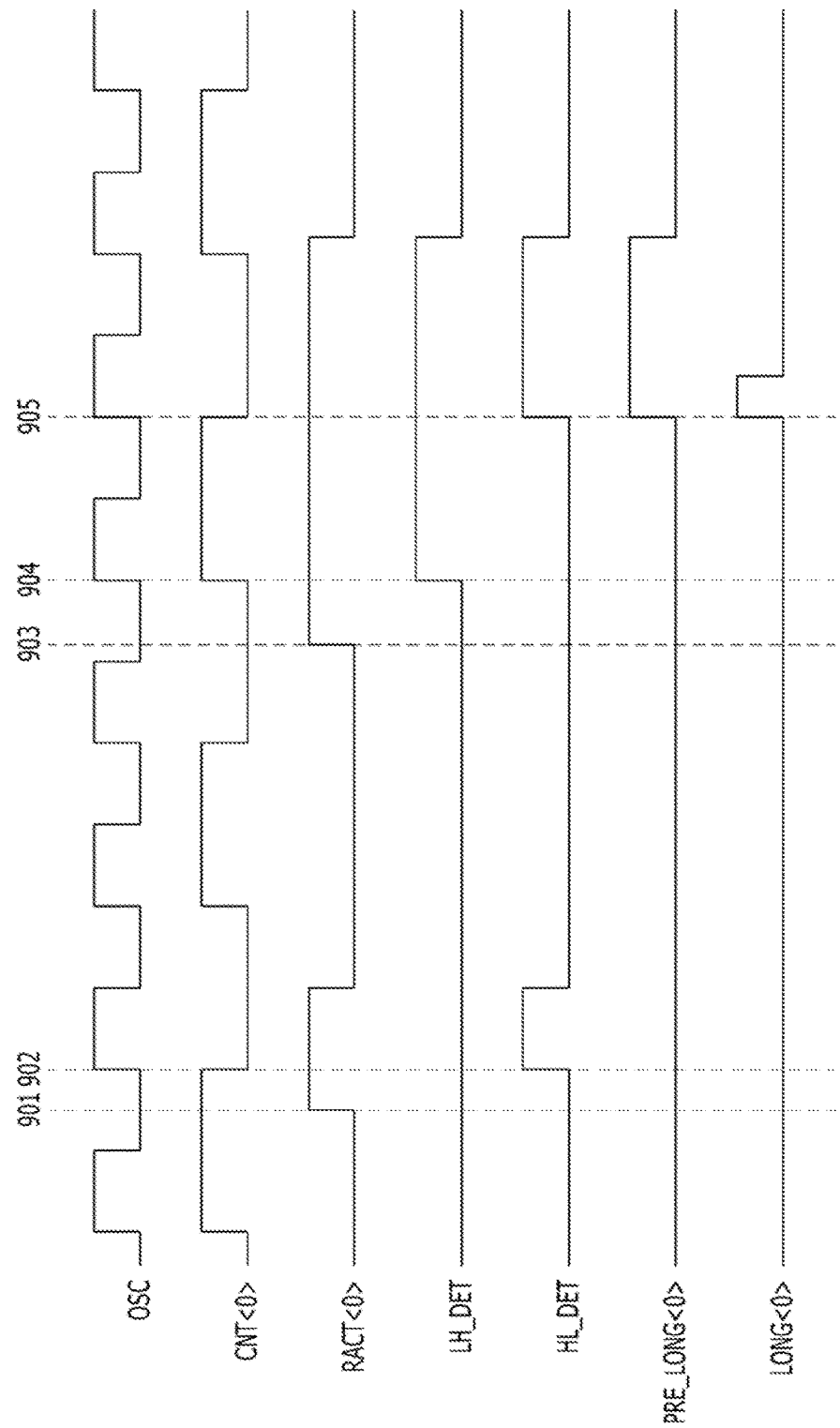
FIG. 9 is a timing diagram illustrating an operation of the first measurement block 260_0 shown in FIG. 8.

FIG. 9 is a timing diagram illustrating an operation of the first measurement block 260_0 shown in FIG. 8.

Referring to FIG. 9, the bit CNT<0>, which is the LSB of the code CODE<0:1>, may transition once for each period of the periodic wave OSC.

The first active signal RACT<0> may be enabled at a moment 901, and the bit CNT<0> may transition from a logic high level to a logic low level at a moment 902 while the first active signal RACT<0> is enabled, and the second sensing signal HL_DET may be enabled in response to the transition of the bit CNT<0>. The first active signal RACT<0> may be disabled, and the second sensing signal HL_DET may be disabled.

The first active signal RACT<0> may be enabled again at a moment 903, and the bit CNT<0> may transition from a logic low level to a logic high level at a moment 904 while the first active signal RACT<0> is enabled, and the first sensing signal LH_DET may be enabled in response to the transition of the bit CNT<0>. Also, the bit CNT<0> may transition from a logic high level to a logic low level at a moment 905 while the first active signal RACT<0> is enabled, and the second sensing signal HL_DET may be enabled in response to the transition of the bit CNT<0>. While the first sensing signal LH_DET and the second sensing signal HL_DET are enabled, the preliminary signal PRE_LONG<0> may be enabled, and the threshold signal LONG<0>, which is a pulse signal enabled at a moment when the preliminary signal PRE_LONG<0> is enabled, may be enabled.

Figure 10:
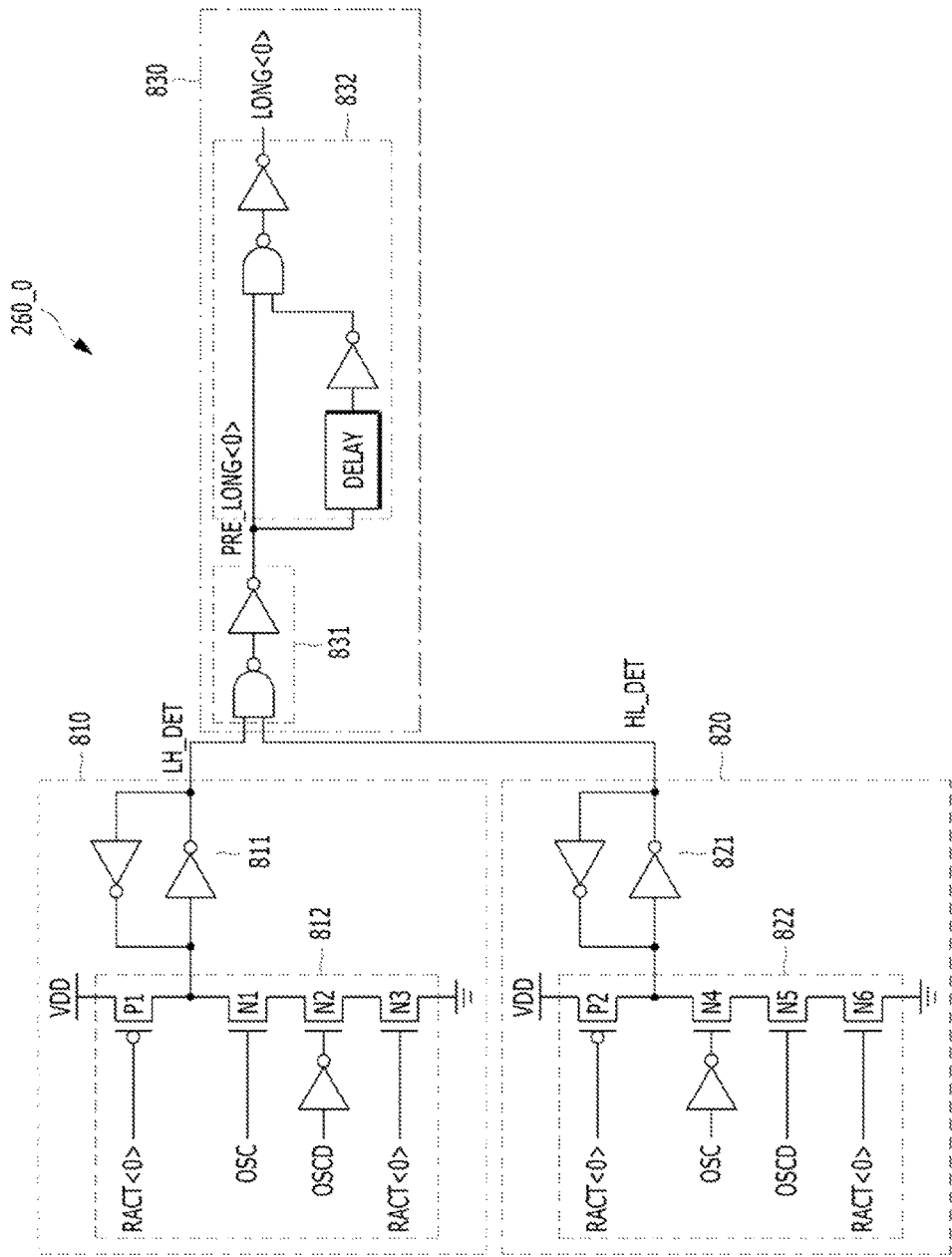
FIG. 10 is a circuit diagram exemplarily illustrating the first measurement block 260_0 shown in FIG. 2.

FIG. 10 is a circuit diagram exemplarily illustrating the first measurement block 260_0 shown in FIG. 2. Although FIG. 10 illustrates the first measurement block 260_0, the second to fourth measurement blocks 260_1 to 260_3 may be designed in a similar way as shown in FIG. 10.

The first measurement block 260_0 shown in FIG. 10 receives the periodic wave OSC instead of the bit CNT<0> and operates differently from the first measurement block 260_0 shown in FIG. 8. It may be formed the same and operate with the first measurement block 260_0 shown in FIG. 8. Since the periodic wave OSC has a ½ period of the bit CNT<0>, the period of the periodic wave OSC in the first measurement block 260_0 shown in FIG. 10 has to be doubled in comparison with the period of the periodic wave OSC in the first measurement block 260_0 shown in FIG. 8. The counter 240 shown in FIG. 2 may be omitted in the first measurement block 260_0 shown in FIG. 10, and the periodic wave OSC generated from the oscillator 230 may be designed to be directly inputted to the measurement blocks 260_0 to 260_3.

In accordance with the embodiments of the present invention, the data of word lines disposed adjacent to a word line which is activated for a long period may be prevented from being lost.

Further, word lines which are activated for a long period may be efficiently detected for each memory bank.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the scope of the present invention as defined by the following claims.

Also, dispositions and types of logic gates and transistors described in the aforementioned embodiments may be implemented differently based on the polarity of the inputted signal.

What is claimed is:

1. A memory device, comprising:
   a counter suitable for counting the number of times that a periodic wave is enabled and generating a code;
   one or more memory banks each including a plurality of word lines; and
   one or more measurement blocks corresponding to the memory banks, respectively, and suitable for measuring an active period of a word line, selected when an active operation or a refresh operation is performed, in a corresponding memory bank among the memory banks, wherein each of the measurement blocks measures the active period of the word line based on a first value of the code at an activation starting point of the corresponding memory bank and a current value of the code.

2. The memory device of claim 1, further comprising:
one or more refresh blocks corresponding to the memory banks, respectively, and suitable for refreshing word lines in a corresponding memory bank among the memory banks,
wherein each of the refresh blocks refreshes one or more word lines adjacent to a first word line when an active period of the first word line is measured to exceed a threshold value by a corresponding measurement block among the measurement blocks.

3. The memory device of claim 1, wherein each of the measurement blocks includes:
a latch suitable for latching the code at the activation starting point of the corresponding memory bank; and
a sensing unit suitable for generating a corresponding threshold signal based on a value of a latched code stored in the latch and the current value of the code.

4. The memory device of claim 3, wherein the sensing unit enables the corresponding threshold signal when the difference between the values of the latched code and the code exceeds a predetermined value.

5. The memory device of claim 3, wherein the sensing unit is enabled for an active period of the corresponding memory bank.

6. The memory device of claim 1, further comprising:
an oscillator suitable for generating the periodic wave.

7. A memory device, comprising:
one or more memory banks each including a plurality of word lines; and
one or more measurement blocks corresponding to the memory banks, respectively, and suitable for measuring an active period of a word line, selected when an active operation or a refresh operation is performed, in a corresponding memory bank among the memory banks,
wherein each of the measurement blocks measures the active period of the word line based on the number of times that a periodic wave transitions in an active period of the corresponding memory bank.

8. The memory device of claim 7, further comprising:
a counter suitable for counting the number of times that the periodic wave is enabled and generating a code,
wherein each of the measurement blocks measures the active period of the word line based on the number of times that a value of the code changes in the active period of the corresponding memory bank.

9. The memory device of claim 7, further comprising:
one or more refresh blocks corresponding to the memory banks, respectively, and suitable for refreshing word lines in a corresponding memory bank among the memory banks,
wherein each of the refresh blocks refreshes one or more word lines adjacent to a first word line when an active period of the first word line is measured to exceed a threshold value by a corresponding measurement block among the measurement blocks.

10. The memory device of claim 8, wherein each of the measurement blocks includes:
a first transition sensing unit suitable for sensing that a predetermined bit of the code transitions from a logic low level to a logic high level in the active period of the corresponding memory bank and generating a first sensing signal;
a second transition sensing unit suitable for sensing that the predetermined bit of the code transitions from the logic high level to the logic low level in the active period of the corresponding memory bank and generating a second sensing signal; and
a threshold signal generation unit suitable for generating a corresponding threshold signal based on the first sensing signal and the second sensing signal.

11. The memory device of claim 10, wherein the first transition sensing unit includes:
a first latch suitable for latching the first sensing signal; and
a first driving part suitable for driving the first sensing signal to a disabling level when an active signal of the corresponding memory bank is disabled and driving the first sensing signal to an enabling level when the predetermined bit transitions from the logic low level to the logic high level while the active signal of the corresponding memory bank is enabled.

12. The memory device of claim 10, wherein second transition sensing unit includes:
a second latch suitable for latching the second sensing signal; and
a second driving part suitable for driving the second sensing signal to a disabling level when an active signal of the corresponding memory bank is disabled and driving the second sensing signal to an enabling level when the predetermined bit transitions from the logic high level to the logic low level while the active signal of the corresponding memory bank is enabled.

13. The memory device of claim 10, wherein the threshold signal generation unit includes:
an enabling part suitable for enabling a preliminary signal when the first sensing signal and the second sensing signal are enabled; and
a pulse generation part suitable for generating the corresponding threshold signal, which is a pulse signal enabled at a moment when the preliminary signal is enabled.

14. The memory device of claim 7, further comprising:
an oscillator suitable for generating the periodic wave.

15. The memory device of claim 7, wherein each of the measurement blocks includes:
a first transition sensing unit suitable for sensing the periodic wave transitioning from a logic low level to a logic high level in the active period of the corresponding memory bank and generating a first sensing signal;
a second transition sensing unit suitable for sensing the periodic wave transitioning from the logic high level to the logic low level in the active period of the corresponding memory bank and generating a second sensing signal; and
a threshold signal generation unit suitable for generating a corresponding threshold signal based on the first sensing signal and the second sensing signal.

16. A memory device, comprising:
a counter suitable for counting the number of times that a periodic wave is enabled and generating a code;
an active signal generation block suitable for generating first to $N^{th}$ active signals based on an active command, a precharge command and a bank address, wherein the N is a natural number greater than 1;

first to $N^{th}$ memory banks suitable for activating a word line selected in response to a corresponding active signal among the first to $N^{th}$ active signals; and first to $N^{th}$ measurement blocks suitable for measuring an active period of a corresponding active signal during an active operation or a refresh operation, among the first to $N^{th}$ active signals based on the code.

17. The memory device of claim 16, further comprising:
a refresh circuit suitable for performing a control to refresh one or more word lines disposed adjacent to a word line selected in a $K^{th}$ memory bank among the first to $N^{th}$ memory banks when it is measured in the first to $N^{th}$ measurement blocks that an active period of a $K^{th}$ active signal exceeds a threshold value among the first to $N^{th}$ active signals, where the K is a natural number ranging from 1 to N.

18. The memory device of claim 16, wherein each of the first to $N^{th}$ measurement blocks includes:
a latch suitable for latching the code at an activation starting point of the corresponding active signal; and
a sensing unit suitable for generating a corresponding threshold signal based on a value of a latched code stored in the latch and a current value of the code.

19. The memory device of claim 18, wherein the sensing unit enables the corresponding threshold signal when the difference between the values of the latched code and the code exceeds a predetermined value.

20. The memory device of claim 18, wherein the sensing unit is enabled in the active period of the corresponding active signal.

21. The memory device of claim 16, wherein each of the first to $N^{th}$ measurement blocks includes:
a first transition sensing unit suitable for sensing that a predetermined bit of the code transitions from a logic low level to a logic high level in the active period of the corresponding active signal and generating a first sensing signal;
a second transition sensing unit suitable for sensing that the predetermined bit of the code transitions from the logic high level to the logic low level in the active period of the corresponding active signal and generating a second sensing signal; and
a threshold signal generation unit suitable for generating a corresponding threshold signal based on the first sensing signal and the second sensing signal.

22. The memory device of claim 16, further comprising:
an oscillator suitable for generating the periodic wave.

* * * * *